(12) United States Patent
Yoshii

(10) Patent No.: US 7,737,465 B2
(45) Date of Patent: Jun. 15, 2010

(54) SEMICONDUCTOR APPARATUS AND MANUFACTURING METHOD THEREOF

(75) Inventor: Ryo Yoshii, Kyoto (JP)

(73) Assignee: Panasonic Corporation, Osaka (JP)

(*) Notice: Subject to any disclaimer, the term of this patent is extended or adjusted under 35 U.S.C. 154(b) by 10 days.

(21) Appl. No.: 12/268,028

(22) Filed: Nov. 10, 2008

(65) Prior Publication Data

US 2009/0146241 A1    Jun. 11, 2009

(30) Foreign Application Priority Data

Dec. 5, 2007    (JP)    ............................ P2007-314817

(51) Int. Cl.
*H01L 29/74* (2006.01)

(52) U.S. Cl. .................. 257/109; 257/130; 257/155; 257/476; 257/495; 257/E29.271

(58) Field of Classification Search ................. 257/109, 257/130, 155, 280, 284, 476, 495, E29.271
See application file for complete search history.

(56) References Cited

U.S. PATENT DOCUMENTS 6,936,850 B2 *    8/2005    Friedrichs et al. ............. 257/77

FOREIGN PATENT DOCUMENTS

JP    2002-246610    8/2002

* cited by examiner

*Primary Examiner*—Jack Chen
(74) *Attorney, Agent, or Firm*—McDermott Will & Emery LLP

(57) ABSTRACT

The present invention provides a semiconductor apparatus for improving a switching speed and a withstand voltage, and a manufacturing method of the semiconductor apparatus. The semiconductor apparatus of the invention including a first conductive type semiconductor substrate, a first conductive type first semiconductor region with an impurity concentration lower than that of the semiconductor substrate and formed on a first principal surface of the semiconductor substrate, a second conductive type second semiconductor region formed in a surface region of the first semiconductor region and which forms a PN junction with the first semiconductor region, a contact region including a part of the first semiconductor region and a part of the second semiconductor region, an insulating layer having an opening part through which at least the contact region are exposed, a first electrode formed so as to be in contact with at least the contact region and a second electrode formed on a second principal surface of the semiconductor substrate, wherein the second semiconductor region, viewed from a direction perpendicular to the first principal surface includes a first region in which a plurality of islands of the second semiconductor are aligned with intervals and a second region which connects each end of the islands of the first region each other.

4 Claims, 5 Drawing Sheets

SEMICONDUCTOR APPARATUS AND MANUFACTURING METHOD THEREOF

BACKGROUND OF THE INVENTION

The present invention relates to a semiconductor apparatus and a manufacturing method thereof, and particularly to improvement in a switching speed and a withstand voltage of a semiconductor apparatus.

In recent years, a withstand high-voltage and a speedup in a switching speed are strongly required in a semiconductor apparatus used in, for example, a power source apparatus or a flat panel display such as a plasma display or a liquid crystal display. In order to respond to the recent requirement, a semiconductor element disclosed in JP-A-2002-246610 has an MPS (Merged Pin/Schottky Diode) structure in which a pn diode and a Schottky diode are placed in parallel inside one chip.

FIG. 5 is a top view of the semiconductor element disclosed in the above mentioned reference. Also, FIG. 6 is a sectional view taken on line A-A of the semiconductor element shown in FIG. 5. In addition to FIG. 5, an anode electrode 13 is shown in FIG. 6. In the semiconductor element 1 shown in FIGS. 5 and 6, plural $P^+$-type silicon regions 15 are formed at equal distances in an island shape in a surface of an N-type silicon region 12 formed on an $N^+$-type silicon layer 11. An insulating film 16 having an opening 16a is formed on an upper part of the N-type silicon region 12 including $P^+$-type silicon regions 15a positioned in the outermost periphery of the $P^+$-type silicon regions 15. Further, as shown in FIG. 6, the anode electrode 13 is disposed on the insulating film 16, the $P^+$-type silicon regions 15 and the N-type silicon region 12 exposed from the opening 16a of the insulating film 16. A cathode electrode 14 is disposed on a lower surface of the $N^+$-type silicon layer 11, that is, a surface opposite to the anode electrode 13.

In the semiconductor element 1, the insulating film 16 is formed on the upper parts of the $P^+$-type silicon regions 15a positioned in the outermost periphery of the $P^+$-type silicon regions 15 so that the anode electrode 13 is not in contact with the $P^+$-type silicon regions 15a. Also, the $P^+$-type silicon regions 15 are arranged so as to form a depletion layer 30 substantially integrated as shown in FIG. 7 at the time of applying a reverse voltage.

However, the semiconductor element 1 described above becomes the so-called pinch-off state in which depletion layers formed by a PN junction between the N-type silicon region 12 and the island-shaped $P^+$-type silicon regions 15 under a reverse voltage application are mutually coupled and are substantially integrated. At this time, a region in which the depletion layers extending from the adjacent $P^+$-type silicon regions 15 overlap becomes a discontinuous state and a withstand voltage reduces as compared with depletion layers extending in a continuous state. Also, the depletion layers extending from the island-shaped $P^+$-type silicon regions 15 have a predetermined large curvature, but at the time of applying a reverse voltage, an electric field concentrates in the portion of its curvature and a reduction in a withstand voltage is caused.

An object of the invention is to provide a semiconductor apparatus for improving a switching speed and a withstand voltage, and a manufacturing method of the semiconductor apparatus.

BRIEF SUMMARY OF THE INVENTION

The invention provides a semiconductor apparatus including a first conductive type semiconductor substrate, a first conductive type first semiconductor region with an impurity concentration lower than that of the semiconductor substrate and formed on a first principal surface of the semiconductor substrate, a second conductive type second semiconductor region formed in a surface region of the first semiconductor region and which forms a PN junction with the first semiconductor region, a contact region including a part of the first semiconductor region and a part of the second semiconductor region, an insulating layer having an opening part through which at least the contact region are exposed, a first electrode formed so as to be in contact with at least the contact region and a second electrode formed on a second principal surface of the semiconductor substrate. In addition, the second semiconductor region, viewed from a direction perpendicular to the first principal surface including a first region in which a plurality of islands of the second semiconductor are aligned with intervals, and a second region which connects each end of the islands of the first region each other.

Preferably, in the semiconductor apparatus described above, a corner of the second semiconductor region has a round shape.

Preferably, in the semiconductor apparatus described above, the first electrode is formed of aluminum or an alloy primarily including aluminum.

Preferably, in the semiconductor apparatus described above, a Schottky junction between the first electrode and the first semiconductor region is formed and an ohmic junction between the first electrode and the second semiconductor region is formed.

The invention provides a manufacturing method of a semiconductor apparatus including the steps of forming a first conductive type first semiconductor region with an impurity concentration lower than that of a first conductive type semiconductor substrate on a first principal surface of the semiconductor substrate, performing first masking having an opening part with a shape including a first region in which a plurality of islands are aligned with an interval and a second region in which each end of the plural of islands of the first region are connected each other on a surface region of the first semiconductor region, injecting an impurity into the first semiconductor region from the opening part and forming a second conductive type second semiconductor region which forms a PN junction with the first semiconductor region and thereafter removing the first masking, performing second masking for covering at least a part of the second semiconductor region and a part of the first semiconductor region used as an electrical contact region and forming an insulating layer on a surface of the first semiconductor region and thereafter removing the second masking, forming a first electrode in contact with the second semiconductor region and the first semiconductor region of at least the contact region and forming a second electrode on a second principal surface of the semiconductor substrate.

According to a semiconductor apparatus and a manufacturing method of the semiconductor apparatus of the present invention, a second semiconductor region is formed from a first and a second region as described above. The first region is a plurality of lines of the second type semiconductor region aligned with intervals. The second region is connections between each end of the lines of the first region. This configuration of the second semiconductor region makes the curvature of the depletion layer extending from the second semiconductor region small. As the curvature of the depletion layer is small, the electric field concentration on the area with the curvature is weakened and reduction in a withstand voltage is prevented.

Also, the small curvature of the depletion layer makes the overlapping of the depletion layer extending from the adjoining second semiconductor region continuous when a reverse voltage is applied and the depletion layer are substantially integrated. Therefore, the withstand voltage gets closer to that of theoretical value of the semiconductor substrate and are improved. As a result, specific resistance of the semiconductor substrate can be decreased so that avalanche characteristics and switching characteristics of the semiconductor apparatus improve and forward characteristics of the semiconductor apparatus are improved.

DETAILED DESCRIPTION OF THE PREFERRED EMBODIMENT

An embodiment of the invention is described with reference to the drawings.

Figure 1:
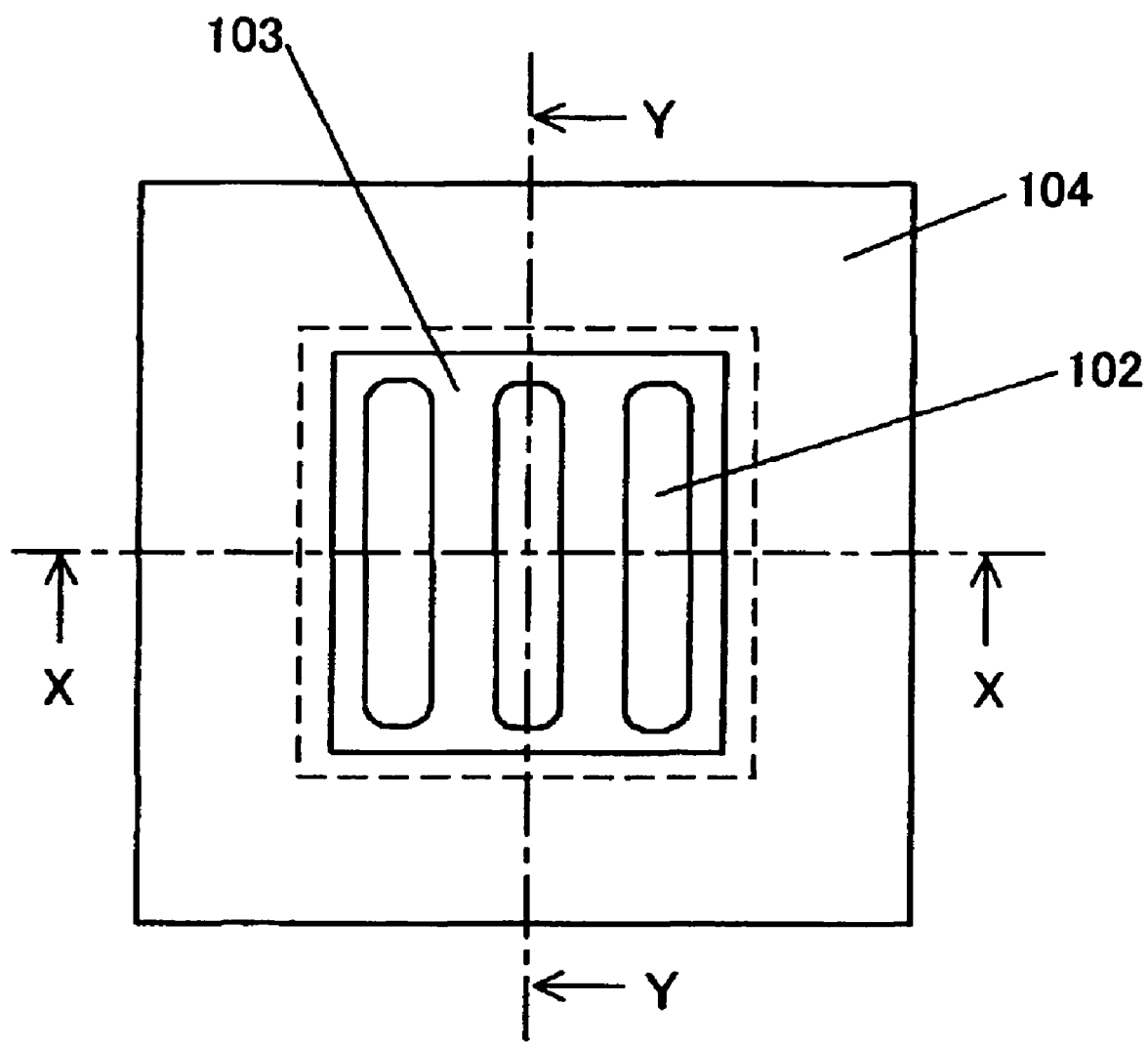
FIG. 1 is a top view of a semiconductor apparatus of one embodiment.
Figure 2:
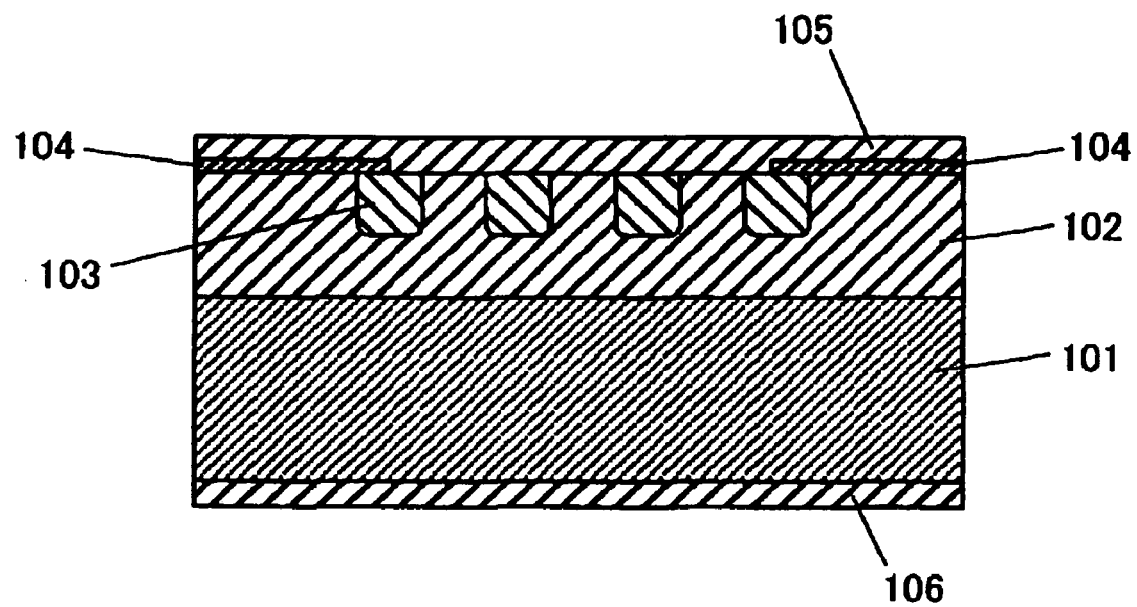
FIG. 2 is a sectional view taken on line X-X of the semiconductor apparatus shown in FIG. 1.
Figure 3:
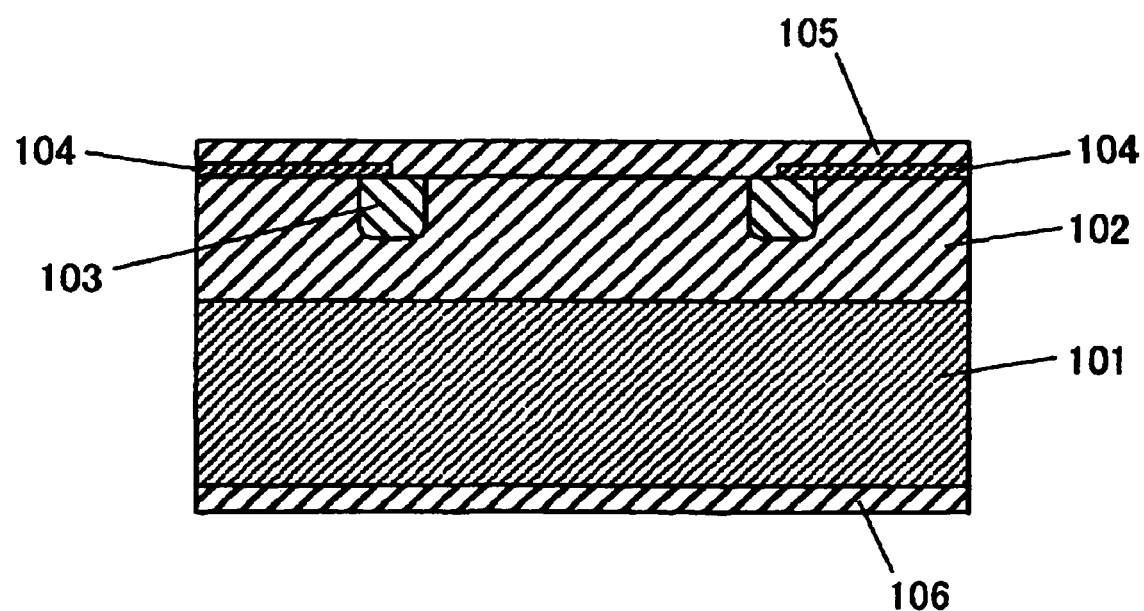
FIG. 3 is a sectional view taken on line Y-Y of the semiconductor apparatus shown in FIG. 1.

FIG. 1 is a top view of a semiconductor apparatus of one embodiment. FIG. 2 is a sectional view taken on line X-X of the semiconductor apparatus shown in FIG. 1. FIG. 3 is a sectional view taken on line Y-Y of the semiconductor apparatus shown in FIG. 1. In the semiconductor apparatus of one embodiment shown in FIGS. 1 to 3, a low-concentration N-type semiconductor region 102 with an impurity concentration lower than that of an N-type semiconductor substrate 101 is formed on an upper surface of the N-type semiconductor substrate 101 and a P-type semiconductor region 103 is formed in a part of the surface region of the low-concentration N-type semiconductor region 102. The P-type semiconductor region 103 and the low-concentration N-type semiconductor region 102 form a PN junction between them.

When the semiconductor apparatus of the embodiment is a product with a withstand voltage of 300 V, the N-type semiconductor substrate 101 with a specific resistance value of about 10 MΩ·cm to 15 MΩ·cm is used. Also, the low-concentration N-type semiconductor region 102 is formed on the N-type semiconductor substrate 101 by an epitaxial growth technique.

As shown in FIG. 1, the P-type semiconductor region 103, viewed in a top view, has a shape in which four rectangular floating islands are aligned with same interval between adjoining islands and each end of islands are connected each other. A depth in which the P-type semiconductor region 103 extends inside the low-concentration N-type semiconductor region 102 is about 5 μm and a distance between the mutual floating islands is 5 μm to 20 μm. In addition, the shape of the P-type semiconductor region 103 is not limited to this shape, and shapes in which each of the terminations of plural floating islands having shapes such as a circle, an ellipse or a polygon in top view is mutually connected are possibly used.

When a reverse voltage is applied to the semiconductor apparatus of the embodiment, it becomes the so-called pinch-off state in which depletion layers extending from the P-type semiconductor region 103 are mutually coupled and are substantially integrated. Since the P-type semiconductor region 103 has the shape in which each of the terminations of plural floating islands lined at equal distances is mutually connected, a curvature of the depletion layer extending from the P-type semiconductor region 103 at the time of applying the reverse voltage is decreased. When the curvature of the depletion layer is small, an electric field concentrating in the portion of the curvature is reduced. Therefore, a reduction in a withstand voltage is prevented. In addition, when the portion constructing the corner of the P-type semiconductor region 103 is rounded, the curvature of the depletion layer can be decreased further and the reduction in the withstand voltage is further prevented.

Also, in the embodiment, an insulating layer 104 having an opening 104a is formed on an outer peripheral region of the low-concentration N-type semiconductor region 102 which has a predetermined width and includes an outer peripheral portion of the P-type semiconductor region 103. The insulating layer 104 is formed by a silicon oxide film etc. From here, in description of the embodiment, a part of the P-type semiconductor region 103 and the low-concentration N-type semiconductor region 102 exposed from the opening 104a of the insulating layer 104 is called a "contact region".

An anode electrode 105 is formed on the insulating layer 104 and the contact region. The anode electrode 105 is in contact with the P-type semiconductor region 103 and the low-concentration N-type semiconductor region 102 of the contact region and is formed by aluminum or an alloy primarily consisting of aluminum. A contact between the low-concentration N-type semiconductor region 102 and the anode electrode 105 is a Schottky junction, and a contact between the anode electrode 105 and P-type semiconductor region 103 is a Ohmic junction.

A cathode electrode 106 is formed on a lower surface of the N-type semiconductor substrate 101, that is, a surface opposite to the anode electrode 105. The cathode electrode 106 is in ohmic contact with the N-type semiconductor substrate 101.

Figure 4A:
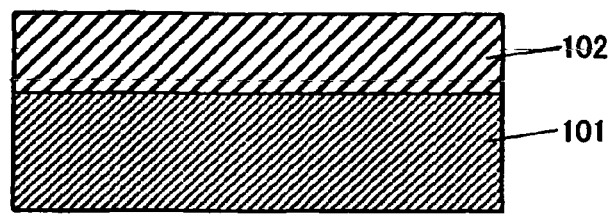
FIGS. 4A, 4B, 4C and 4D are sectional views along a step flow of a manufacturing method of the semiconductor apparatus shown in FIG. 1.
Figure 4B:
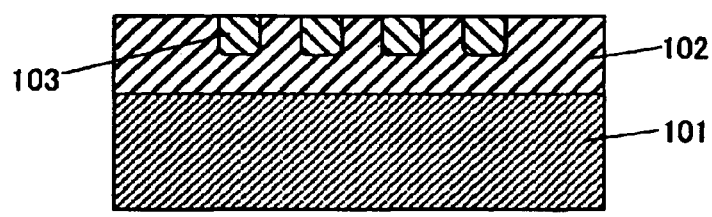

Next, a manufacturing method of the semiconductor apparatus of the embodiment is described. FIG. 4 is a sectional view along a step flow of a manufacturing method of the semiconductor apparatus shown in FIG. 1. First, a low-concentration N-type semiconductor region 102 with an impurity concentration lower than that of an N-type semiconductor substrate 101 is formed on an upper surface of the N-type semiconductor substrate 101 by an epitaxial growth method (FIG. 4A). Next, after masking with an opening of a shape, that is each of the terminations of plural rectangles lined at equal distances is mutually connected is performed on a surface of the low-concentration N-type semiconductor region 102, boron is injected into the opening part as impurities by a thermal diffusion method. At this, P-type semiconductor region 103 is formed in a floating island state and thereafter, the masking is removed (FIG. 4B).

At this manufacturing step, a curvature of a depletion layer extending from the P-type semiconductor region 103 is decreased by disposing a predetermined curvature (roundness) at the corner of the opening part of the masking performed on the surface of the low-concentration N-type semiconductor region 102. Also, control of distribution or a concentration of the impurities is facilitated by using an ion implantation method when injecting boron into the opening part of the masking.

Figure 4C:
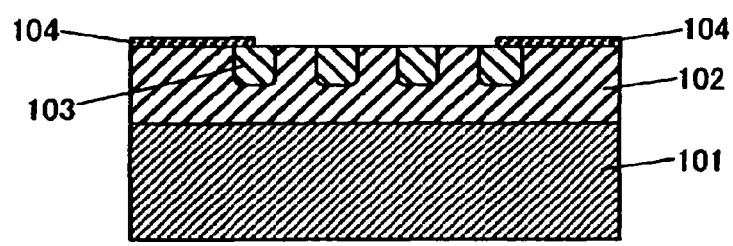
Figure 4D:
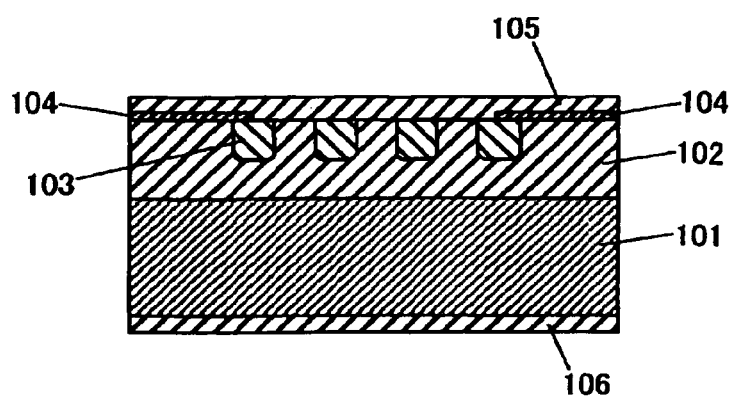
Figure 5:
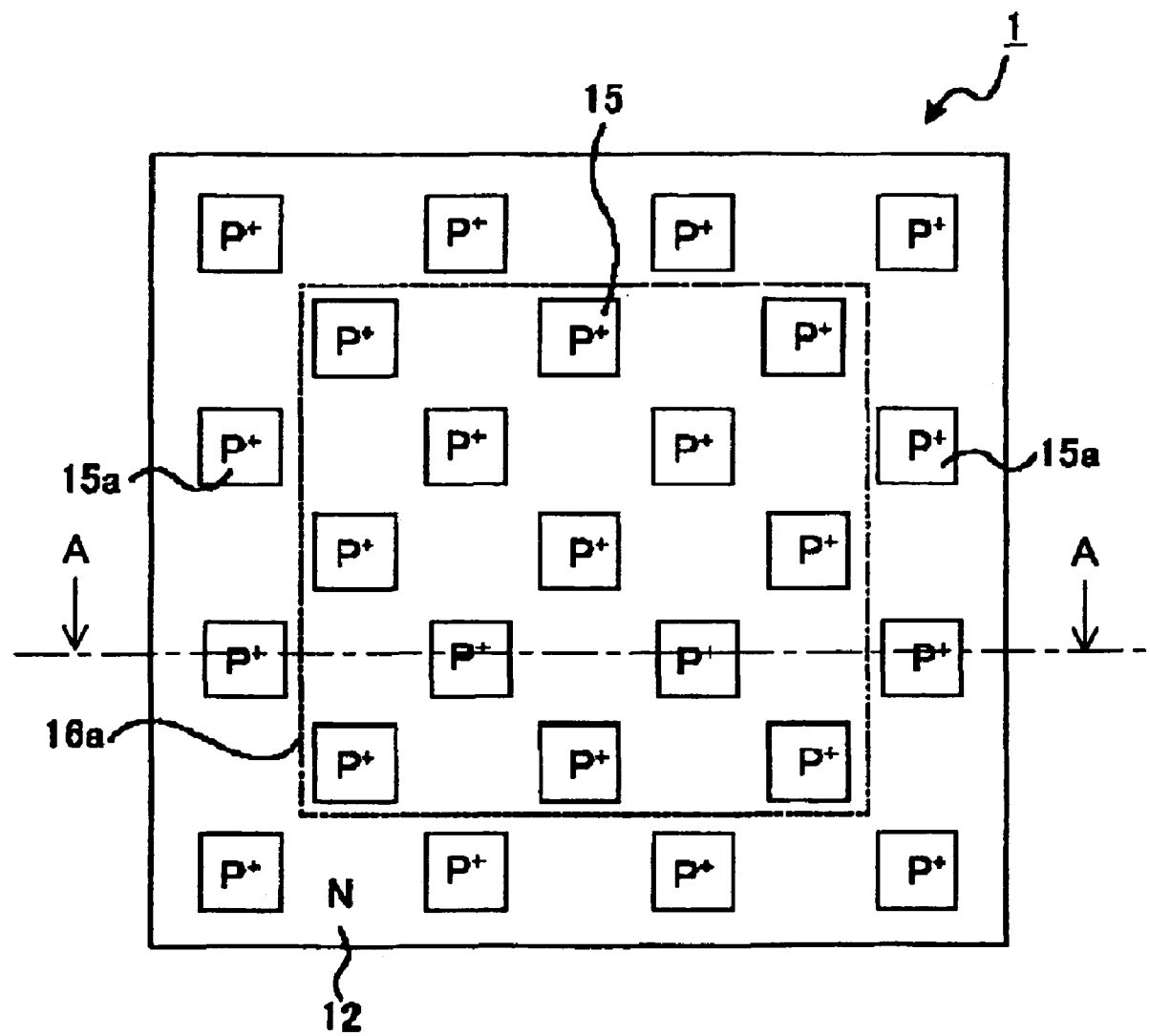
FIG. 5 is a top view of a semiconductor element disclosed in JP-2002-246610.
Figure 6:
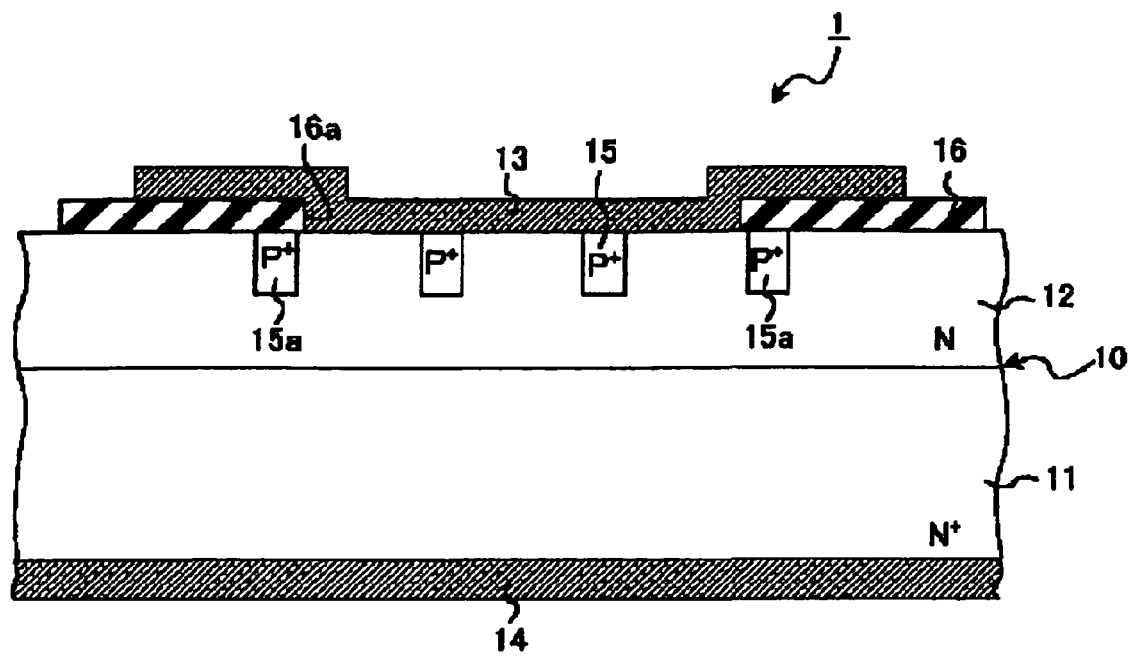
FIG. 6 is a sectional view taken on line A-A of the semiconductor element shown in FIG. 5.
Figure 7:
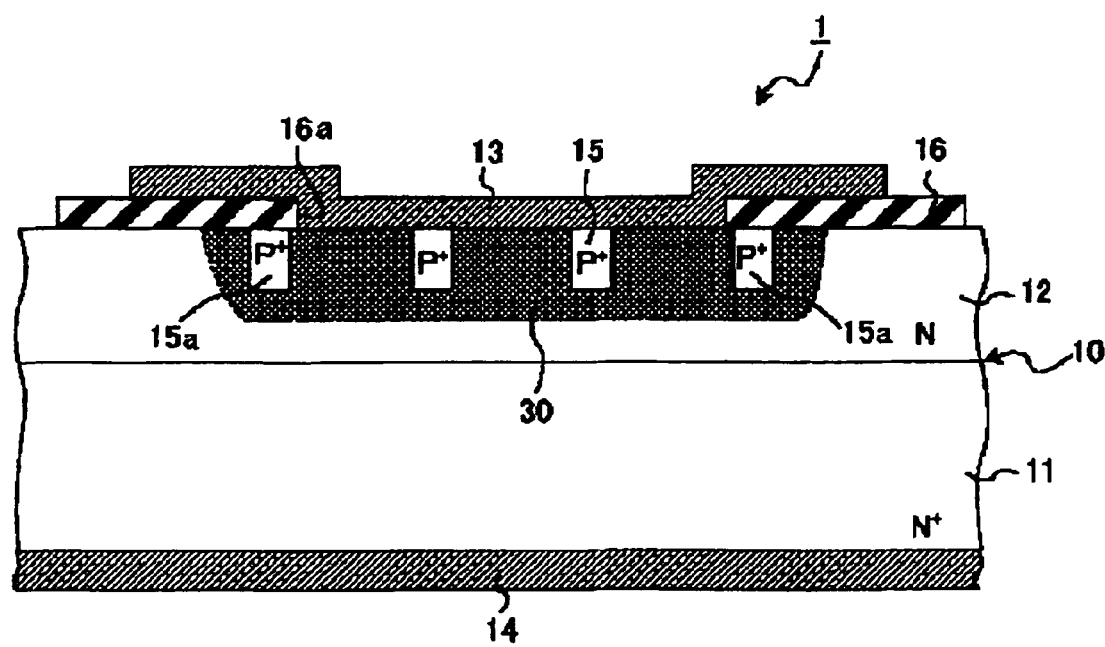
FIG. 7 is a sectional view taken on line A-A of the semiconductor element shown in FIG. 5 in which a depletion layer is formed at the time of applying a reverse voltage.

Then, after performing masking for covering a part of the region of the P-type semiconductor region 103 and the low-concentration N-type semiconductor region 102 used as the contact region described above, a silicon oxide film is formed as an insulating layer 104 and, after that, the masking is removed (FIG. 4C). Then, an anode electrode 105 is formed by evaporating aluminum or an aluminum alloy so as to cover the P-type semiconductor region 103 and the low-concentration N-type semiconductor region 102 of at least the contact region. Further, a cathode electrode 106 made of a metal capable of an ohmic junction is formed on a lower surface of the N-type semiconductor substrate 101 (FIG. 4D). As a result of that, a Schottky junction between the low-concentration N-type semiconductor region 102 and the anode electrode 105 is made and an ohmic junction between the P-type semiconductor region 103 and the anode electrode 105 is made.

According to the semiconductor apparatus of the embodiment as described above, a curvature of a depletion layer extending from the P-type semiconductor region 103 at the time of applying a reverse voltage is small, so that the depletion layer tends to extend continuously and a withstand voltage approaches a theoretical withstand voltage of a wafer material. As a result of that, specific resistance of the wafer material (N-type semiconductor substrate 101) can be decreased so that avalanche characteristics and switching characteristics of the semiconductor apparatus improve and forward characteristics of the semiconductor apparatus can be improved.

In addition, a P-type semiconductor substrate may be used instead of the N-type semiconductor substrate 101 and a low-concentration P-type semiconductor region may be used instead of the low-concentration N-type semiconductor region 102 and an N-type semiconductor region may be used instead of the P-type semiconductor region 103. Also, in the embodiment, the insulating layer 104 has been formed on an outer peripheral region of the low-concentration N-type semiconductor region 102 including an outer peripheral portion of the P-type semiconductor region 103, but it is unnecessary to form the insulating layer 104 on the outer peripheral portion of the P-type semiconductor region 103. That is, the insulating layer 104 may be formed on the outer peripheral region of the low-concentration N-type semiconductor region 102 excluding the outer peripheral portion of the P-type semiconductor region 103.

A semiconductor apparatus and a manufacturing method of the semiconductor apparatus according to the invention are useful as a technique related to a semiconductor apparatus with good switching characteristics and a withstand high-voltage and a manufacturing method of the semiconductor apparatus. Particularly, they are suitable for an FRD (Fast Recovery Diode) in which an MPS (Merged pin/Schottky Diode) structure is adopted.

What is claimed is:

1. A semiconductor apparatus comprising:
   a first conductive type semiconductor substrate;
   a first conductive type first semiconductor region with an impurity concentration lower than that of the semiconductor substrate and formed on a first principal surface of the semiconductor substrate;
   a second conductive type second semiconductor region formed in a surface region of the first semiconductor region and which forms a PN junction with the first semiconductor region;
   a contact region including a part of the first semiconductor region and a part of the second semiconductor region;
   an insulating layer having an opening part through which at least the contact region are exposed;
   a first electrode formed so as to be in contact with at least the contact region; and
   a second electrode formed on a second principal surface of the semiconductor substrate,
   wherein the second semiconductor region, viewed from a direction perpendicular to the first principal surface, comprises:
   a first region in which a plurality of islands of the second semiconductor region are aligned with intervals; and
   a second region which connects each end of the islands of the first region each other.

2. The semiconductor apparatus according to claim 1, wherein a corner of the second semiconductor region has a round shape.

3. The semiconductor apparatus according to claim 1, wherein the first electrode is formed of aluminum or an alloy primarily including aluminum.

4. A semiconductor apparatus according to claims 1, wherein a Schottky junction between the first electrode and the first semiconductor region is formed and an ohmic junction between the first electrode and the second semiconductor region is formed.

* * * * *